(12) United States Patent
Takebayashi (10) Patent No.: US 11,810,767 B2
(45) Date of Patent: Nov. 7, 2023

(54) WAFER PLACEMENT DEVICE

(71) Applicant: NGK INSULATORS, LTD., Nagoya (JP)

(72) Inventor: Hiroshi Takebayashi, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 692 days.

(21) Appl. No.: 17/000,711

(22) Filed: Aug. 24, 2020

(65) Prior Publication Data
US 2020/0388471 A1    Dec. 10, 2020

Related U.S. Application Data

(63) Continuation of application No. PCT/JP2019/035436, filed on Sep. 10, 2019.

(30) Foreign Application Priority Data

Sep. 13, 2018  (JP) .................................. 2018-171405

(51) Int. Cl.
*H01J 37/32* (2006.01)
*H01L 21/67* (2006.01)
(Continued)

(52) U.S. Cl.
CPC .. *H01J 37/32642* (2013.01); *H01J 37/32724* (2013.01); *H01L 21/67103* (2013.01);
(Continued)

(58) Field of Classification Search
CPC ........... H01L 21/3065; H01L 21/68785; H01L 21/68714; H01L 21/68735;
(Continued)

(56) References Cited

U.S. PATENT DOCUMENTS

2002/0029745 A1*  3/2002  Nagaiwa ........... H01L 21/67103
                                                         118/728
2007/0258186 A1*  11/2007  Matyushkin ........ H01L 21/6875
                                                           361/234
(Continued)

FOREIGN PATENT DOCUMENTS

JP    2002-016126 A1    1/2002
JP    2007-300119 A1    11/2007
(Continued)

OTHER PUBLICATIONS

Machine translation of Torii Japanese Patent Document JP 2018-050039 A Mar. 29, 2018 (Year: 2018).*
(Continued)

*Primary Examiner* — Kevin J Comber
(74) *Attorney, Agent, or Firm* — BURR PATENT LAW, PLLC (57) ABSTRACT

A wafer placement device includes a wafer placement stage including a wafer electrostatic chuck and a wafer cooling plate, a focus-ring placement stage including a focus-ring electrostatic chuck and a focus-ring cooling plate, and a clamping member arranged around the focus-ring placement stage. The wafer placement stage, the focus-ring placement stage, and the clamping member are separate from one another. A pressing portion of the focus-ring cooling plate presses a wafer cooling plate flange against a mounting plate. The clamping member is fastened to the mounting plate with bolts in a state of pressing a flange against the mounting plate at its flange, thus fixing the wafer placement stage and the focus-ring placement stage to the mounting plate without directly fastening them to the mounting plate.

7 Claims, 7 Drawing Sheets

(51) Int. Cl.
  *H01L 21/683* (2006.01)
  *H01L 21/687* (2006.01)
(52) U.S. Cl.
  CPC .... *H01L 21/6833* (2013.01); *H01L 21/68721* (2013.01); *H01L 21/68735* (2013.01); *H01J 2237/002* (2013.01); *H01J 2237/2007* (2013.01)
(58) Field of Classification Search
  CPC ......... H01L 21/68721; H01L 21/67103; H01L 21/6831; H01L 21/6833; H01L 21/67109; H02N 13/00; H01J 37/32724; H01J 37/32642; H01J 2237/2007; H01J 2237/002
  USPC ........................................................ 361/234
  See application file for complete search history.

(56) References Cited

U.S. PATENT DOCUMENTS

| | | | | |
|---|---|---|---|---|
| 2011/0031217 A1* | 2/2011 | Himori | ............. | H01J 37/32165 156/345.48 |
| 2014/0146434 A1* | 5/2014 | Uchida | ............. | H01J 37/32715 361/234 |
| 2014/0209245 A1* | 7/2014 | Yamamoto | ........ | H01J 37/32091 361/234 |
| 2017/0278737 A1* | 9/2017 | Koiwa | ................ | H01L 21/6833 |
| 2018/0182635 A1* | 6/2018 | Tsukahara | ........... | C23C 16/4585 |

FOREIGN PATENT DOCUMENTS

| | | | | |
|---|---|---|---|---|
| JP | 2014-107387 A1 | 6/2014 | | |
| JP | 2014-150104 A1 | 8/2014 | | |
| JP | 2015-220413 A1 | 12/2015 | | |
| JP | 2015220413 A | * 12/2015 | ........... | H01L 21/683 |
| JP | 2016-184645 A | 10/2016 | | |
| JP | 2016-207979 A1 | 12/2016 | | |
| JP | 2017-174889 A1 | 9/2017 | | |
| JP | 2018-050039 A1 | 3/2018 | | |
| JP | 2018050039 A | * 3/2018 | | |
| JP | 2018-107433 A1 | 7/2018 | | |

OTHER PUBLICATIONS

Machine translation of Kaneko et al. Japanese Patent Document JP 2015-220413 A Dec. 7, 2015 (Year: 2015).*
English translation of the International Preliminary Report on Patentability (Chapter I) (Application No. PCT/JP2019/035436) dated Mar. 25, 2021.
International Search Report and Written Opinion (Application No. PCT/JP2019/035436) dated Nov. 5, 2019.
Chinese Office Action dated Jun. 7,2023 (Application No. 201980016643.6).

* cited by examiner

Related Art

Fig. 7

Related Art

WAFER PLACEMENT DEVICE

BACKGROUND OF THE INVENTION

1. Field of the Invention

The present invention relates to a wafer placement device.

2. Description of the Related Art

Hitherto, a wafer placement device is used to perform CVD, etching, etc. on a wafer by utilizing plasma. For example, Patent Literature (PTL) 1 discloses a wafer placement device including a metal base constituted by a disk-shaped center-side metal base and an annular outer-peripheral-side metal base that are coupled to each other, a disk-shaped center-side electrostatic chuck heater disposed on an upper surface of the central-side metal base, and an annular outer-peripheral-side electrostatic chuck heater disposed on an upper surface of the outer-peripheral-side metal base. In the disclosed wafer placement device, a disk-shaped wafer is electrostatically attracted to an upper surface of the center-side electrostatic chuck heater, and an annular focus ring is electrostatically attracted to an upper surface of the outer-peripheral-side electrostatic chuck heater. Furthermore, temperature of the wafer and temperature of the focus ring are controlled individually.

Figure 6:
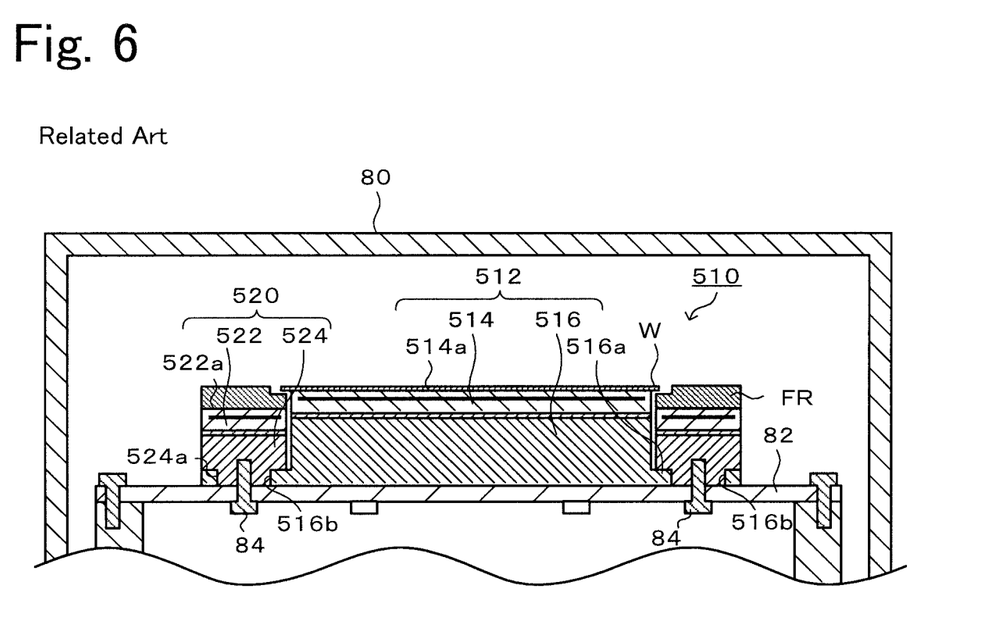
FIG. 6 illustrates a usage state when a wafer W is processed by using a wafer placement device 510.

Meanwhile, there is also known a wafer placement device 510 illustrated in FIG. 6. The wafer placement device 510 includes a wafer placement stage 512 and a focus-ring placement stage 520, and it is fixed to a mounting plate 82 inside a chamber 80. The wafer placement stage 512 includes a wafer electrostatic chuck 514 and a wafer cooling plate 516 bonded to a surface of the wafer electrostatic chuck 514 on the side opposite to a surface 514a on which a wafer W is placed. The wafer W is electrostatically attracted to the surface 514a when a DC voltage is applied to an electrostatic electrode that is incorporated in the wafer electrostatic chuck 514. The focus-ring placement stage 520 is a ring-shaped member being separate from the wafer placement stage 512 and arranged around the wafer placement stage 512. The focus-ring placement stage 520 includes a focus-ring electrostatic chuck 522 and a focus-ring cooling plate 524 bonded to a surface of the focus-ring electrostatic chuck 522 on the side opposite to a surface 522a on which a focus ring FR is placed. The focus ring FR is a member having a larger thickness than the wafer W and is electrostatically attracted to the surface 522a when a DC voltage is applied to an electrostatic electrode that is incorporated in the focus-ring electrostatic chuck 522. The wafer cooling plate 516 includes a wafer cooling plate flange 516a projecting radially outward from an end portion of the wafer cooling plate 516 on the side closer to the mounting plate 82 onto which the wafer placement device 510 is mounted. A plurality of through-holes 516b is formed in the wafer cooling plate flange 516a along a circumferential direction. The wafer placement stage 512 is fixed to the mounting plate 82 with the aid of the focus-ring placement stage 520 by, in a state in which projections 524a formed on a rear surface of the focus-ring cooling plate 524 are fitted to the through-holes 516b, tightening bolts 84 into screw holes of the projections 524a from a rear surface of the mounting plate 82.

CITATION LIST

Patent Literature

PTL 1: Japanese Unexamined Patent Application Publication No. 2016-207979

SUMMARY OF THE INVENTION

Figure 7:
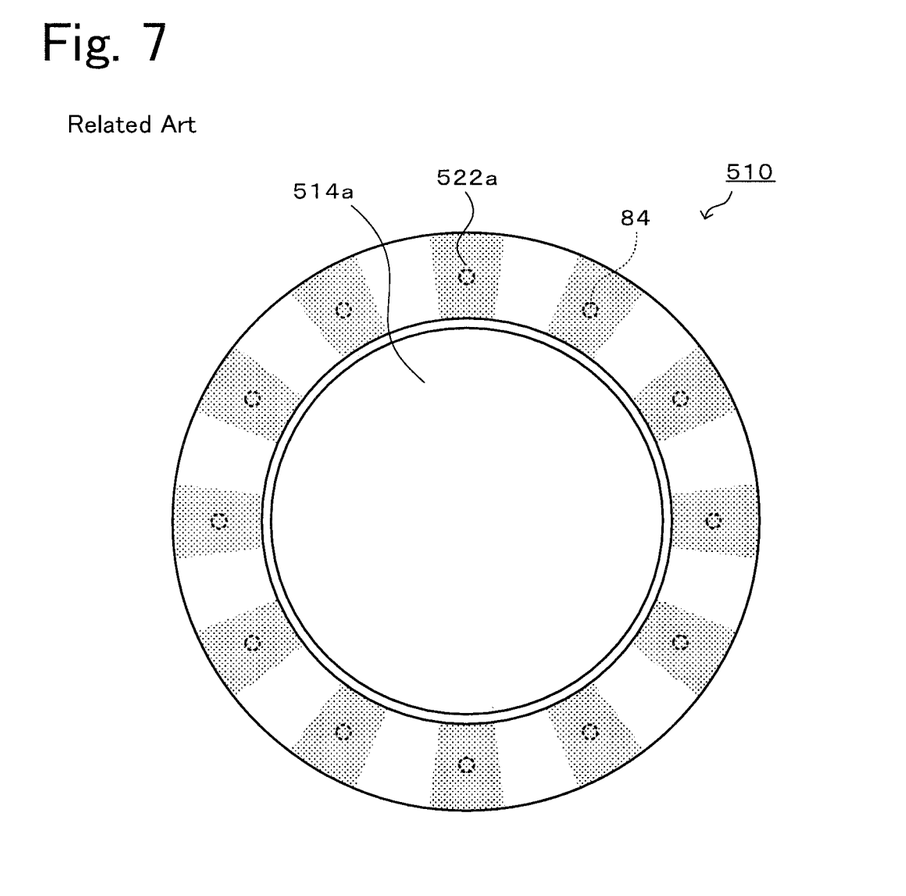
FIG. 7 is a plan view of the wafer placement device 510.

In the wafer placement device 510, however, the surface 522a of the focus-ring placement stage 520 is often wavy in the circumferential direction, as illustrated in FIG. 7, due to a height difference between regions of the surface 522a just or near above the bolts 84 and other regions. In FIG. 7, the regions of the surface 522a just or near above the bolts 84 (i.e., relatively low regions) are denoted by hatched areas, and the other regions (i.e., relatively high regions) are denoted by blank white areas. If the surface 522a is wavy in the circumferential direction, a problem arises in that, even when trying to attract the focus ring FR to the surface 522a by the focus-ring electrostatic chuck 522, the focus ring FR is only partially attracted to the surface 522a because the focus ring FR is fairly thick, and that it is difficult to adjust the temperature of the focus ring FR.

The present invention has been made with intent to solve the above-described problem, and a main object of the present invention is to avoid a focus-ring placement surface from becoming wavy in a circumferential direction.

A wafer placement device of the present invention includes:

a wafer placement stage including a wafer electrostatic chuck and a wafer cooling plate attached to a surface of the wafer electrostatic chuck on side opposite to a wafer placement surface thereof;

a focus-ring placement stage being separate from the wafer placement stage, arranged around the wafer placement stage, and including a focus-ring electrostatic chuck and a focus-ring cooling plate attached to a surface of the focus-ring electrostatic chuck on side opposite to a focus-ring placement surface thereof; and a clamping member being separate from the focus-ring placement stage and arranged around the focus-ring placement stage, wherein the wafer cooling plate includes a wafer cooling plate flange projecting radially outward from an outer peripheral surface of an end portion of the wafer cooling plate on a side closer to a mounting plate onto which the wafer placement device is mounted;

the focus-ring cooling plate includes a pressing portion that presses the wafer cooling plate flange against the mounting plate, and a focus-ring cooling plate flange projecting radially outward from an outer peripheral surface of an end portion of the focus-ring cooling plate on side closer to the mounting plate, and the clamping member is fastened to the mounting plate with fasteners in a state of pressing the focus-ring cooling plate flange against the mounting plate, thus fixing the wafer placement stage and the focus-ring placement stage to the mounting plate without directly fastening the wafer placement stage and the focus-ring placement stage to the mounting plate.

In the above wafer placement device, the clamping member is fastened to the mounting plate by the fasteners in the state of pressing the focus-ring cooling plate flange against the mounting plate, whereby the wafer placement stage and the focus-ring placement stage are fixed to the mounting plate without directly fastening them to the mounting plate.

Therefore, the clamping member may have different heights between regions near the fasteners and other regions, and may become wavy in a circumferential direction. However, since the focus-ring placement stage is not fastened directly by the fasteners and is fixed to the mounting plate by the action of pressing force applied through the clamping member, the focus-ring placement surface is held substantially flat. Thus, according to the wafer placement device of the present invention, the focus-ring placement surface can be avoided from becoming wavy in the circumferential direction. As a result, a focus ring with a relatively large thickness can be firmly attracted to the focus-ring placement surface by the focus-ring electrostatic chuck.

In the wafer placement device of the present invention, the clamping member may be one ring member or may be constituted by a plurality of arc-shaped members arrayed in the form of a ring. In either case, the above-described advantageous effects can be obtained. However, the former case is more preferable because the pressing force applied to the focus-ring cooling plate is easier to distribute in the former case than in the latter case.

In the wafer placement device of the present invention, a thermal resistance spacer may be interposed between the wafer cooling plate flange of the wafer cooling plate and the pressing portion of the focus-ring cooling plate. This feature can suppress an influence of the focus-ring cooling plate on temperature control of the wafer and an influence of the wafer cooling plate on temperature control of the focus ring. As a result, the temperature control of the wafer and the temperature control of the focus ring can be performed independently of each other.

In the wafer placement device of the present invention, the focus-ring placement surface may be a surface inclined to cancel a height gradient between an inner peripheral portion and an outer peripheral portion of the focus-ring placement surface, the height gradient being generated when the focus-ring cooling plate flange is pressed against the mounting plate by the clamping member. With this feature, the focus-ring placement surface can be made more flat in a state in which the wafer placement device is fixed to the mounting plate.

In the wafer placement device of the present invention, a thermal resistance spacer may be interposed between the wafer cooling plate flange and the wafer cooling plate and the pressing portion of the focus-ring cooling plate, and the thermal resistance spacer may have a thickness inclined to cancel a height gradient between an inner peripheral portion and an outer peripheral portion of the focus-ring placement surface, the height gradient being generated when the focus-ring cooling plate flange is pressed against the mounting plate by the clamping member. In this case, the thermal resistance spacer can provide not only the advantageous effect that the temperature control of the wafer and the temperature control of the focus ring can be performed independently of each other, but also the advantageous effect that the focus-ring placement surface can be made more flat in the state in which the wafer placement device is fixed to the mounting plate.

In the wafer placement device of the present invention, a seal ring arranged between the focus-ring cooling plate and the mounting plate on the inner peripheral side of the focus-ring cooling plate and a seal ring arranged between the wafer cooling plate and the mounting plate on the outer peripheral side of the wafer cooling plate may be replaced with one common seal ring. In the above-mentioned type of wafer placement device, an atmosphere between the wafer cooling plate and the mounting plate and an atmosphere between the focus-ring cooling plate and the mounting plate are held independently of each other in some cases. In such cases, it is general to arrange a seal ring between the wafer cooling plate and the mounting plate on the outer peripheral side of the wafer cooling plate, and to arrange another seal ring between the focus-ring cooling plate and the mounting plate on the inner peripheral side of the focus-ring cooling plate. However, when the two seal rings are replaced with one common seal ring as described above, the space and the cost of the seal ring can be reduced in comparison with those needed when the two seal rings are separately disposed, and pressing force exerted on the seal ring (i.e., the pressing force applied through the clamping member), which is necessary to obtain appropriate sealing performance, can be reduced.

DETAILED DESCRIPTION OF THE INVENTION

Figure 1:
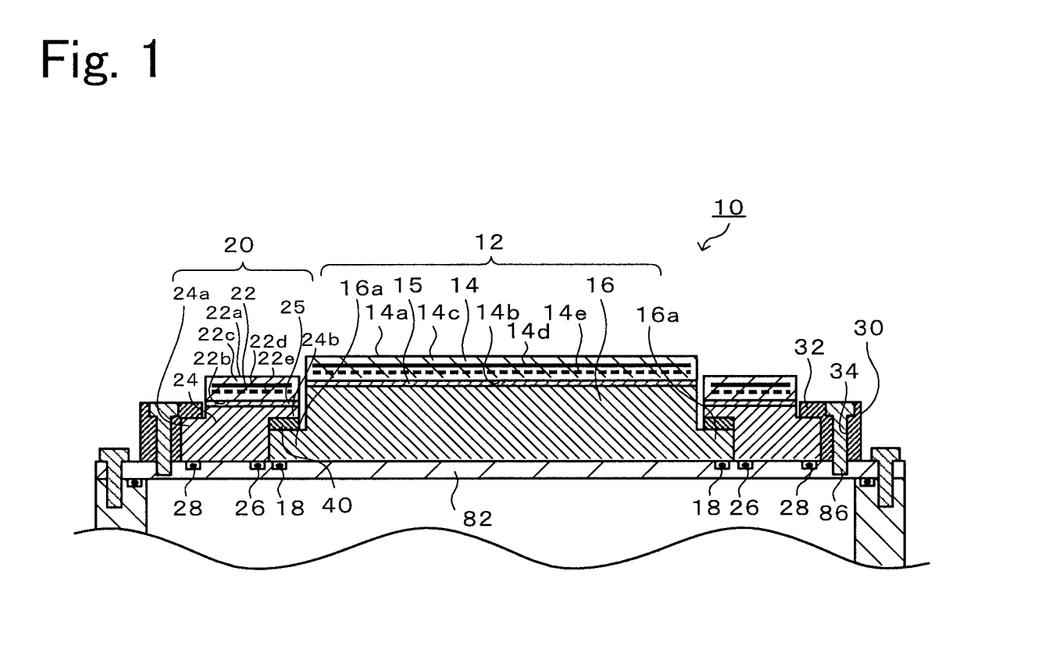
FIG. 1 is a vertical sectional view of a wafer placement device 10 fixed to a mounting plate 82.
Figure 2:
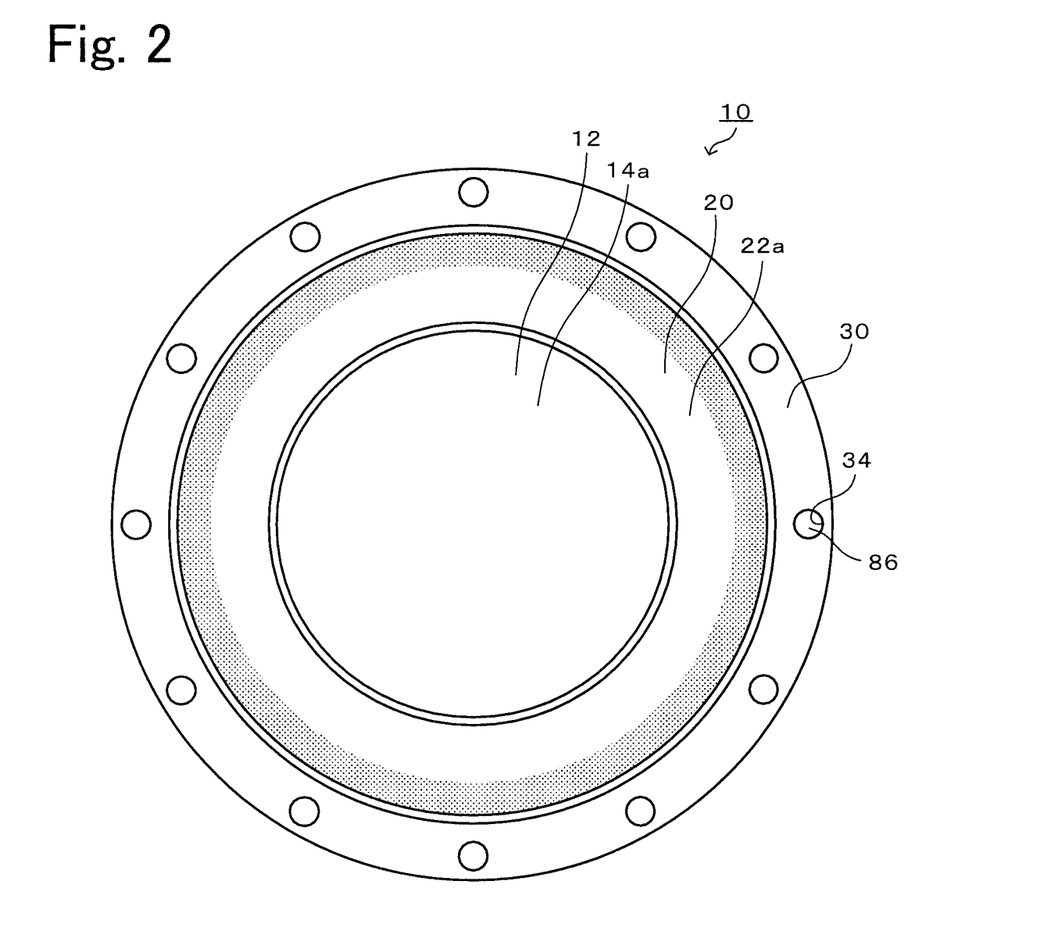
FIG. 2 is a plan view of the wafer placement device 10.

Preferred embodiments of the present invention will be described below with reference to the drawings. FIG. 1 is a vertical sectional view of a wafer placement device 10 fixed to a mounting plate 82, and FIG. 2 is a plan view of the wafer placement device 10.

The wafer placement device 10 is used to perform CVD, etching, etc. on a wafer W by utilizing plasma and is fixed to the mounting plate 82 that is disposed inside a chamber 80 (see FIG. 3) for a semiconductor process. The wafer placement device 10 includes a wafer placement stage 12, a focus-ring placement stage 20, and a clamping member 30.

The wafer placement stage 12 includes a wafer electrostatic chuck 14 and a wafer cooling plate 16. The wafer cooling plate 16 is bonded to a rear surface 14b of the wafer electrostatic chuck 14 on the side opposite to a surface 14a, serving as a wafer placement surface, with a bonding sheet 15 interposed therebetween.

The wafer electrostatic chuck 14 is constituted by embedding an electrostatic electrode 14d and a resistive heating element 14e in a ceramic base member 14c.

The ceramic base member 14c is a disk-shaped plate made of a ceramic material represented by aluminum nitride, silicon carbide, silicon nitride, or aluminum oxide, for example. Not-illustrated many recesses and projections are formed on the surface 14a of the ceramic base member 14c by embossing. Heat transfer gas (e.g., He gas) is supplied from a not-illustrated gas supply path to between each of the recesses formed on the surface 14a and the wafer W (see FIG. 3) placed on the surface 14a. The gas supply paths are formed to penetrate through the mounting plate 82, the wafer cooling plate 16, the bonding sheet 15, and the wafer electrostatic chuck 14.

The electrostatic electrode 14d is formed of a conductive mesh or plate and is disposed parallel (including a substantially parallel state, this is similarly applied to the following description) to the surface 14a. A rear surface of the electrostatic electrode 14d is connected to a not-illustrated power supply rod that is inserted into the ceramic base member 14c after penetrating through the mounting plate 82, the wafer cooling plate 16, and the bonding sheet 15. A DC voltage is applied to the electrostatic electrode 14d through the power supply rod.

The resistive heating element 14e is formed of a conductive coil or printed pattern and is provided over the entirety of the surface 14a in a one-stroke pattern from one end to the other end. The one end and the other end of the resistive heating element 14e are connected to a pair of not-illustrated power supply rods that are inserted into the ceramic base member 14c after penetrating through the mounting plate 82, the wafer cooling plate 16, and the bonding sheet 15. A voltage is applied to the resistive heating element 14e through the pair of power supply rods.

The wafer cooling plate 16 is a disk-shaped plate made of a metal represented by aluminum or an aluminum alloy, for example, and it includes therein a not-illustrated coolant path through which a coolant can circulate. The coolant path is connected to a coolant supply path and a coolant discharge path both penetrating through the mounting plate 82. The coolant discharged from the coolant discharge path is returned to the coolant supply path again after temperature of the discharged coolant has been adjusted. The wafer cooling plate 16 includes a wafer cooling plate flange 16a projecting radially outward from an outer peripheral surface of a lower end portion of the wafer cooling plate 16 (i.e., of its end portion on the side closer to the mounting plate 82).

The focus-ring placement stage 20 is separate from the wafer placement stage 12 and is arranged around the wafer placement stage 12. The focus-ring placement stage 20 includes a focus-ring electrostatic chuck 22 and a focus-ring cooling plate 24. The focus-ring cooling plate 24 is bonded to a rear surface 22b of the focus-ring electrostatic chuck 22 on the side opposite to a surface 22a, serving as a focus-ring placement surface, with a bonding sheet 25 interposed therebetween.

The focus-ring electrostatic chuck 22 is constituted by embedding an electrostatic electrode 22d and a resistive heating element 22e in a ceramic base member 22c. The ceramic base member 22c is a ring-shaped plate made of a similar material to that of the ceramic base member 14c. Many recesses and projections are formed on the surface 22a of the ceramic base member 22c by embossing. Heat transfer gas (e.g., He gas) is supplied from a not-illustrated gas supply path to between each of the recesses formed on the surface 22a and the focus ring FR (see FIG. 3) placed on the surface 22a. The gas supply paths are formed to penetrate through the mounting plate 82, the focus-ring cooling plate 24, the bonding sheet 25, and the focus-ring electrostatic chuck 22.

The electrostatic electrode 22d is formed of a conductive mesh or plate and is disposed parallel to the surface 22a. A rear surface of the electrostatic electrode 22d is connected to a not-illustrated power supply rod that is inserted into the ceramic base member 22c after penetrating through the mounting plate 82, the focus-ring cooling plate 24, and the bonding sheet 25. A DC voltage is applied to the electrostatic electrode 22d through the power supply rod.

The resistive heating element 22e is formed of a conductive coil or printed pattern and is provided over the entirety of the surface 22a in a one-stroke pattern from one end to the other end. The one end and the other end of the resistive heating element 22e are connected to a pair of not-illustrated power supply rods that are inserted into the ceramic base member 22c after penetrating through the mounting plate 82, the focus-ring cooling plate 24, and the bonding sheet 25. A voltage is applied to the resistive heating element 22e through the pair of power supply rods.

The focus-ring cooling plate 24 is a ring-shaped plate made of a metal represented by aluminum or an aluminum alloy, for example, and it includes therein a not-illustrated coolant path through which a coolant can circulate. The coolant path is connected to a coolant supply path and a coolant discharge path both penetrating through the mounting plate 82. The coolant discharged from the coolant discharge path is returned to the coolant supply path again after temperature of the discharged coolant has been adjusted. The focus-ring cooling plate 24 includes a focus-ring cooling plate flange 24a projecting radially outward from an outer peripheral surface of a lower end portion of the focus-ring cooling plate 24 (i.e., of its end portion on the side closer to the mounting plate 82). The focus-ring cooling plate 24 further includes a ring-shaped pressing portion 24b projecting radially inward from the outer peripheral surface of an upper end portion of the focus-ring cooling plate 24 (i.e., of its end portion on the side farther away from the mounting plate 82). The pressing portion 24b is a member allowing the wafer cooling plate flange 16a to be pressed against the mounting plate 82 with a thermal resistance spacer 40 interposed therebetween. The thermal resistance spacer 40 is a ring member made of a material having large thermal resistance, such as zirconia or resin.

The clamping member 30 is a ring-shaped member being separate from the focus-ring placement stage 20 and arranged around the focus-ring placement stage 20. The clamping member 30 is made of Al, Ti, SUS, SiSiCTi (metal matrix composite material of Si, SiC and Ti), or suitable one of other nonmagnetic metals and alloys. The clamping member 30 includes a ring-shaped flange 32 projecting radially inward from an inner peripheral surface of an upper end portion of the clamping member 30 (i.e., of its end portion on the side farther away from the mounting plate 82). The flange 32 is a member allowing the focus-ring cooling plate flange 24a to be pressed against the mounting plate 82. As illustrated in FIG. 2, the clamping member 30 includes a plurality (12 here) of through-holes 34 formed at equal intervals in a circumferential direction. The clamping member 30 has a role of enabling the wafer placement stage 12 and the focus-ring placement stage 20 to be fixed to an upper surface of the mounting plate 82 without directly fastening them to the mounting plate 82. An example of procedures for fixing the wafer placement stage 12 and the focus-ring placement stage 20 is described below. First, the wafer placement stage 12 is arranged at a predetermined position on the mounting plate 82, and the ring-shaped thermal resistance spacer 40 is placed on a front surface of the wafer cooling plate flange 16a of the wafer placement stage 12. Then, the focus-ring placement stage 20 is set on the mounting plate 82 such that the pressing portion 24b of the focus-ring placement stage 20 overlies an upper surface of the thermal resistance spacer 40. Then, the clamping member 30 is set on the mounting plate 82 such that the flange 32 of the clamping member 30 overlies an upper surface of the focus-ring cooling plate flange 24a of the focus-ring placement stage 20. In such a state, bolts 86 are inserted into the through-holes 34 of the clamping member 30 and are tightened by being screwed into the screw holes of the mounting plate 82. As a result, the clamping member 30 is fastened to the mounting plate 82 by the bolts 86 in a state in which the flange 32 presses the focus-ring cooling plate flange 24a against the mounting plate 82. Thus, the wafer placement stage 12 and the focus-ring placement stage 20 are fixed to the mounting plate 82 without directly fastening them to the mounting plate 82.

An O-ring is arranged as appropriate between a rear surface of the wafer cooling plate 16 and the front surface of the mounting plate 82. In FIG. 1, for example, an O-ring 18 is arranged along an outer periphery of the rear surface of the wafer cooling plate 16 to make an atmosphere between the rear surface of the wafer cooling plate 16 and the front surface of the mounting plate 82 kept in a state independent of an atmosphere in the surrounding. In addition, between the rear surface of the wafer cooling plate 16 and the front surface of the mounting plate 82, an O-ring may be arranged around an insertion path into which each power supply rod for applying the voltage to the electrostatic electrode 14d or the resistive heating element 14e is inserted, or may be arranged around the coolant supply path through which the coolant is supplied to the not-illustrated coolant path in the wafer cooling plate 16, or around the coolant discharge path through which the coolant is discharged from that coolant path.

Furthermore, an O-ring is arranged as appropriate between a rear surface of the focus-ring cooling plate 24 and the front surface of the mounting plate 82. In FIG. 1, for example, O-rings 26 and 28 are arranged respectively along inner and outer peripheries of the rear surface of the focus-ring cooling plate 24 to make an atmosphere between the rear surface of the focus-ring cooling plate 24 and the front surface of the mounting plate 82 kept in a state independent of an atmosphere in the surrounding. In addition, between the rear surface of the focus-ring cooling plate 24 and the front surface of the mounting plate 82, an O-ring may be arranged around an insertion path into which each power supply rod for applying the voltage to the electrostatic electrode 22d or the resistive heating element 22e is inserted, or may be arranged around the coolant supply path through which the coolant is supplied to the not-illustrated coolant path in the focus-ring cooling plate 24, or around the coolant discharge path through which the coolant is discharged from that coolant path.

Figure 3:
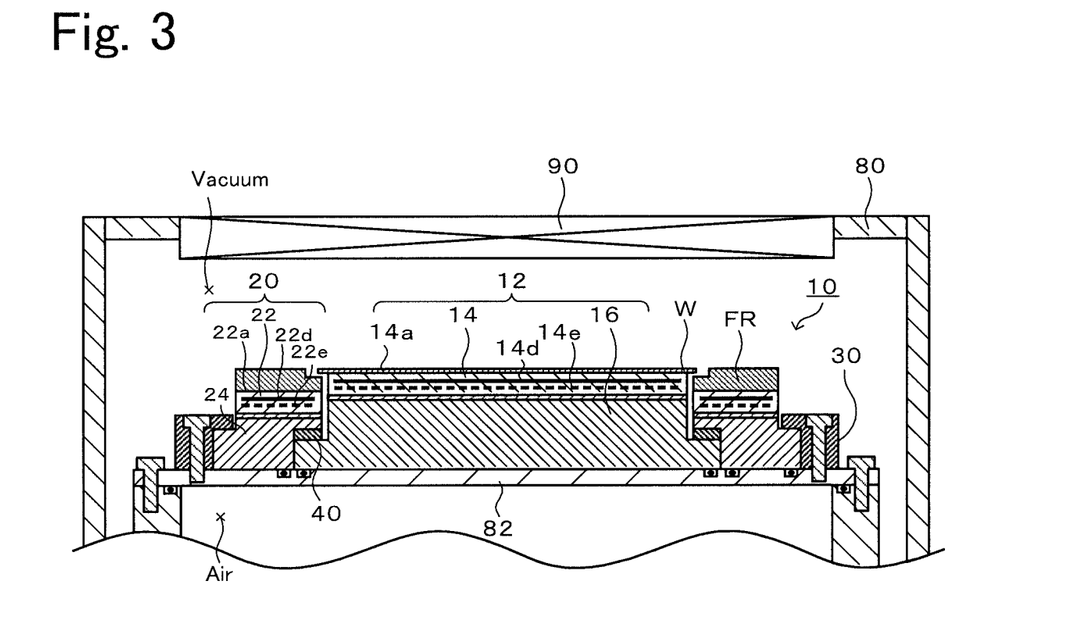
FIG. 3 illustrates a usage state when a wafer W is processed by using the wafer placement device 10.

A usage example of the wafer placement device 10 will be described below with reference to FIG. 3. The mounting plate 82 onto which the wafer placement device 10 is to be mounted is disposed inside the chamber 80. As described above, the wafer placement device 10 is mounted to the mounting plate 82. A shower head 90 for releasing process gas through many gas injection holes into the inside of the chamber 80 is arranged at a ceiling surface of the chamber 80.

The disk-shaped wafer W is placed on the wafer placement surface 14a of the wafer placement device 10. The wafer W is electrostatically attracted to the wafer placement surface 14a with the voltage applied to the electrostatic electrode 14d of the wafer electrostatic chuck 14. Temperature of the wafer W can be controlled by adjusting electric power supplied to the resistive heating element 14e of the wafer electrostatic chuck 14 and/or temperature of the coolant supplied to the not-illustrated coolant path in the wafer cooling plate 16. In this connection, He gas is supplied to between the wafer W and the not-illustrated recesses on the wafer placement surface 14a for the purpose of increasing heat transfer. Temperature control of the wafer W is executed by detecting the temperature of the wafer W with a not-illustrated temperature sensor and by performing feedback control such that the temperature of the wafer W is held at a target temperature.

The focus ring FR is placed on the focus-ring placement surface 22a in the wafer placement device 10. The focus ring FR has a level difference along an inner periphery of its upper end portion to avoid interference with the wafer W. The focus ring FR is electrostatically attracted to the focus-ring placement surface 22a with the voltage applied to the electrostatic electrode 22d of the focus-ring electrostatic chuck 22. Temperature of the focus ring FR can be controlled by adjusting electric power supplied to the resistive heating element 22e of the focus-ring electrostatic chuck 22 and/or temperature of the coolant supplied to the not-illustrated coolant path in the focus-ring cooling plate 24. In this connection, He gas is supplied to between the focus ring FR and the not-illustrated recesses on the focus-ring placement surface 22a for the purpose of increasing heat transfer. Temperature control of the focus ring FR is executed by detecting the temperature of the focus ring FR with a not-illustrated temperature sensor and by performing feedback control such that the temperature of the focus ring FR is held at a target temperature.

In the above-mentioned state, the inside of the chamber 80 is evacuated to be set to a predetermined vacuum atmosphere (or decompressed atmosphere), and plasma is produced by supplying a high-frequency electric power between the wafer cooling plate 16 of the wafer placement stage 12 and the shower head 90 while the process gas is supplied from the shower head 90. Then, CVD film formation or etching is performed on the wafer by utilizing the plasma. A space below the mounting plate 82 is kept under an air atmosphere.

Although the focus ring FR wears down as the wafer W is processed with the plasma, replacement of the focus ring FR may be made after processing a plurality of wafers W because the focus ring FR is fairly thick.

In the wafer placement device 10 described above, the clamping member 30 is fastened to the mounting plate 82 by the bolts 86 in a state of pressing the focus-ring cooling plate flange 24a against the mounting plate 82, whereby the wafer placement stage 12 and the focus-ring placement stage 20 are fixed to the mounting plate 82 without directly fastening them to the mounting plate 82. Therefore, the clamping member 30 may have different heights between regions near the bolts 86 and other regions, and may become wavy in the circumferential direction. However, since the focus-ring placement stage 20 is not fastened directly by the bolts and is fixed to the mounting plate 82 by the action of pressing force applied through the clamping member 30, the focus-ring placement surface 22a is held substantially flat. Thus, according to the wafer placement device 10 of this embodiment, the focus-ring placement surface 22a can be avoided from becoming wavy in the circumferential direction. As a result, the focus ring FR with a relatively large thickness can be firmly attracted to the focus-ring placement surface 22a by the focus-ring electrostatic chuck 22. It is hence possible to easily adjust the temperature of the focus ring FR, and to prevent leak of the He gas that is supplied to the rear surface side of the focus ring FR.

Furthermore, since the clamping member 30 is one ring member, the pressing force applied to the focus-ring cooling plate 24 is easier to distribute. Hence the focus-ring placement surface 22a can be more easily avoided from becoming wavy in the circumferential direction.

Moreover, the thermal resistance spacer 40 is interposed between the wafer cooling plate flange 16a of the wafer cooling plate 16 and the pressing portion 24b of the focus-ring cooling plate 24. The presence of the thermal resistance spacer 40 can suppress an influence of the focus-ring cooling plate 24 on the temperature control of the wafer W and an influence of the wafer cooling plate 16 on the temperature control of the focus ring FR. As a result, the temperature control of the wafer W and the temperature control of the focus ring FR can be performed independently of each other.

The present invention is not limited to the above-described embodiments, and can be carried out by various modes as long as they belong to the technical scope of the invention.

Figure 4:
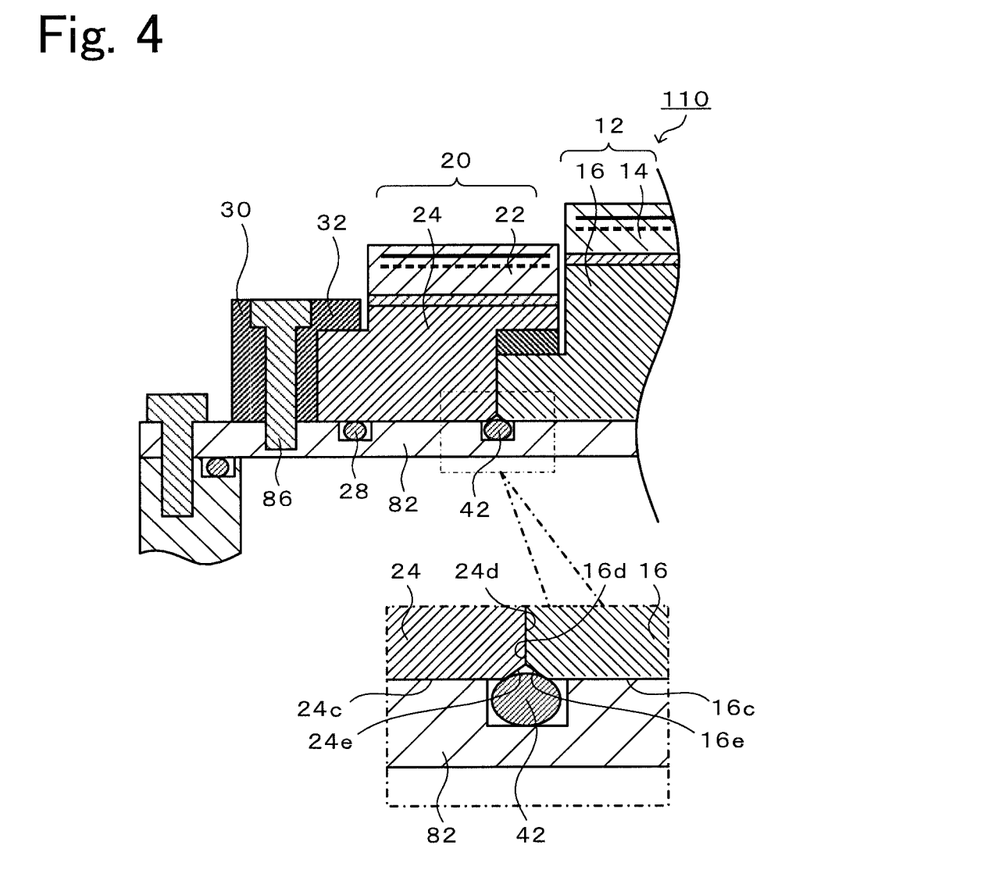
FIG. 4 is a vertical sectional view of a wafer placement device 110.

In the above-described embodiment, as illustrated by way of example in FIG. 1, the O-ring 18 is arranged along the outer periphery of the rear surface of the wafer cooling plate 16, and the O-rings 26 and 28 are arranged respectively along the inner and outer peripheries of the rear surface of the focus-ring cooling plate 24. However, as in a wafer placement device 110 illustrated in FIG. 4, the O-ring 18 and the O-ring 26 may be replaced with one common O-ring 42. In FIG. 4, the same components as those in the above-described embodiment are denoted by the same reference signs. In FIG. 4, a first corner portion 24e defining a boundary between a surface 24c of the focus-ring cooling plate 24 opposing to the mounting plate 82 and a surface 24d thereof opposing to the wafer cooling plate 16 is chamfered. A second corner portion 16e defining a boundary between a surface 16c of the wafer cooling plate 16 opposing to the mounting plate 82 and a surface 16d thereof opposing to the focus-ring cooling plate 24 is also chamfered. The common O-ring 42 is arranged in contact with three surfaces of the first corner portion 24e, the second corner portion 16e, and the mounting plate 82. With such an arrangement, in comparison with those needed when the two O-rings 18 and 26 are separately disposed as illustrated in FIG. 1, the space and the cost of the O-ring can be reduced and pressing force exerted on the O-ring (i.e., the pressing force applied through the clamping member 30), which is necessary to obtain appropriate sealing performance, can be reduced.

Figure 5:
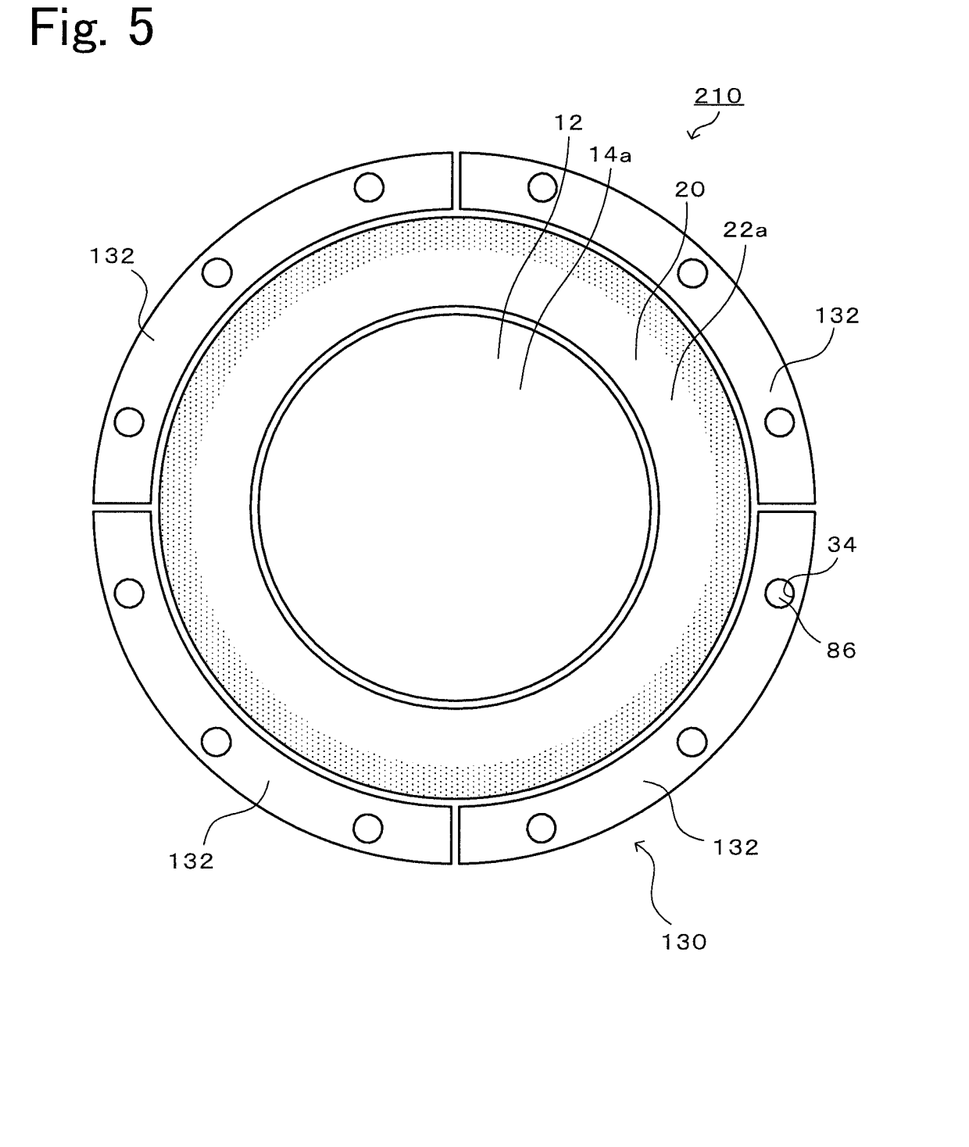
FIG. 5 is a plan view of a wafer placement device 210.

While the above-described embodiment uses one ring-shaped member as the clamping member 30, the present invention is not limited to such a particular case, the clamping member 30 may be constituted by a plurality of arc-shaped members arrayed in the form of a ring. As in a wafer placement device 210 illustrated in FIG. 5, for example, a clamping member 130 constituted by four arc-shaped members 132 arrayed in the form of a ring may be used. In FIG. 5, the same components as those in the above-described embodiment are denoted by the same reference signs. Such an arrangement can also provide similar advantages to those in the above-described embodiment. However, the clamping member 30 is more preferable because the pressing force applied to the focus-ring cooling plate 24 is easier to distribute in the clamping member 30 than in the clamping member 130.

In the above-described embodiment, the focus-ring placement surface 22a is substantially flat. In some cases, however, there may be a height gradient that an outer peripheral portion of the focus-ring placement surface 22a (i.e., a shaded portion of the focus-ring placement surface 22a in FIG. 2) is slightly lower than an inner peripheral portion thereof (i.e., a not-shaded portion of the focus-ring placement surface 22a in FIG. 2). This is because the clamping member 30 presses the flange 24a formed on the outer peripheral side of the focus-ring cooling plate 24 against the mounting plate 82. Taking into account the above point, the focus-ring placement surface 22a may be previously formed as a surface inclined to cancel the above-mentioned height gradient. This can make the focus-ring placement surface 22a more flat in the state in which the wafer placement device 10 is fixed to the mounting plate 82. Alternatively, instead of previously forming the focus-ring placement surface 22a as the inclined surface, the thickness of the thermal resistance spacer 40 may be inclined to cancel the above-mentioned height gradient. In such a case, the thermal resistance spacer 40 can provide not only the advantageous effect that the temperature control of the wafer W and the temperature control of the focus ring FR can be performed independently of each other, but also the advantageous effect that the focus-ring placement surface 22a can be made more flat in the state in which the wafer placement device 10 is fixed to the mounting plate 82.

While the above-described embodiment uses the wafer electrostatic chuck 14 that is constituted by embedding the electrostatic electrode 14d and the resistive heating element 14e, the resistive heating element 14e may be omitted. This point is similarly applied to the focus-ring electrostatic chuck 22.

While, in the above-described embodiment, the bolts 86 are screwed into the mounting plate 82 by inserting them from the upper surface of the clamping member 30, the bolts may be screwed into the clamping member 30 by inserting them from the rear surface of the mounting plate 82.

In the above-described embodiment, an additional thermal resistance spacer may be arranged between an outer peripheral surface of the wafer cooling plate flange 16a and an inner peripheral surface of the focus-ring cooling plate 24. Such an arrangement can further suppress the influence of the focus-ring cooling plate 24 on the temperature control of the wafer W and the influence of the wafer cooling plate 16 on the temperature control of the focus ring FR.

In the above-described embodiment, the wafer cooling plate 16 is bonded to the rear surface 14b of the wafer electrostatic chuck 14 with the bonding sheet 15 interposed therebetween. However, when the wafer cooling plate 16 is made of, for example, a ceramic composite material such as Si—SiC—Ti, the wafer cooling plate 16 may be bonded to the rear surface 14b of the wafer electrostatic chuck 14 by TCB (Thermal compression bonding). TCB implies the well-known method of sandwiching a metal bonding material between two members to be bonded to each other, and press-bonding those two members in a state in which those members are heated to temperature not higher than the solidus temperature of the metal bonding material. This point is similarly applied to the focus-ring cooling plate 24.

The above-described embodiment may include a lift pin for raising and lowering the wafer W. In such a case, an insertion hole into which the lift pin is inserted may be formed to penetrate through the mounting plate 82, the wafer cooling plate 16, the bonding sheet 15, and the wafer electrostatic chuck 14.

The present application claims priority from Japanese Patent Application No. 2018-171405 filed Sep. 13, 2018, the entire contents of which are incorporated herein by reference.

What is claimed is:

1. A wafer placement device comprising:
   a wafer placement stage including a wafer electrostatic chuck and a wafer cooling plate attached to a surface of the wafer electrostatic chuck on side opposite to a wafer placement surface thereof;
   a focus-ring placement stage being separate from the wafer placement stage, arranged around the wafer placement stage, and including a focus-ring electrostatic chuck and a focus-ring cooling plate attached to a surface of the focus-ring electrostatic chuck on side opposite to a focus-ring placement surface thereof; and a clamping member being separate from the focus-ring placement stage and arranged around the focus-ring placement stage, wherein the wafer cooling plate includes a wafer cooling plate flange projecting radially outward from an outer peripheral surface of an end portion of the wafer cooling plate on a side closer to a mounting plate onto which the wafer placement device is mounted;

the focus-ring cooling plate includes a pressing portion that presses the wafer cooling plate flange against the mounting plate, and a focus-ring cooling plate flange projecting radially outward from an outer peripheral surface of an end portion of the focus-ring cooling plate on side closer to the mounting plate, and the clamping member is fastened to the mounting plate with fasteners in a state of pressing the focus-ring cooling plate flange against the mounting plate, thus fixing the wafer placement stage and the focus-ring placement stage to the mounting plate without directly fastening the wafer placement stage and the focus-ring placement stage to the mounting plate.

2. The wafer placement device according to claim 1, wherein the clamping member is one ring member.

3. The wafer placement device according to claim 1, wherein the clamping member is constituted by a plurality of arc-shaped members arrayed in the form of a ring.

4. The wafer placement device according to claim 1, wherein a thermal resistance spacer is interposed between the wafer cooling plate flange of the wafer cooling plate and the pressing portion of the focus-ring cooling plate.

5. The wafer placement device according to claim 1, wherein the focus-ring placement surface is a surface inclined to cancel a height gradient between an inner peripheral portion and an outer peripheral portion of the focus-ring placement surface, the height gradient being generated when the focus-ring cooling plate flange is pressed against the mounting plate by the clamping member.

6. The wafer placement device according to claim 1, wherein a thermal resistance spacer is interposed between the wafer cooling plate flange of the wafer cooling plate and the pressing portion of the focus-ring cooling plate, and the thermal resistance spacer has a thickness inclined to cancel a height gradient between an inner peripheral portion and an outer peripheral portion of the focus-ring placement surface, the height gradient being generated when the focus-ring cooling plate flange is pressed against the mounting plate by the clamping member.

7. The wafer placement device according to claim 1, wherein a seal ring arranged between the focus-ring cooling plate and the mounting plate on an inner peripheral side of the focus-ring cooling plate and a seal ring arranged between the wafer cooling plate and the mounting plate on an outer peripheral side of the wafer cooling plate are one common seal ring.

* * * * *